United States Patent
Corsi et al.

(10) Patent No.: US 6,281,753 B1
(45) Date of Patent: Aug. 28, 2001

(54) MOSFET SINGLE-PAIR DIFFERENTIAL AMPLIFIER HAVING AN ADAPTIVE BIASING SCHEME FOR RAIL-TO-RAIL INPUT CAPABILITY

(75) Inventors: Marco Corsi; Priscilla Escobar-Bowser, both of Plano; Kenneth G. Maclean, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/459,950

(22) Filed: Dec. 13, 1999

Related U.S. Application Data
(60) Provisional application No. 60/112,785, filed on Dec. 18, 1998.

(51) Int. Cl.[7] .................................................. H03F 3/45
(52) U.S. Cl. ........................................... 330/261; 330/258
(58) Field of Search .................................. 330/253, 258, 330/261

(56) References Cited

U.S. PATENT DOCUMENTS

| | | | |
|---|---|---|---|
| 4,379,267 | 4/1983 | Young | 330/253 |
| 5,371,474 | 12/1994 | Wassenaar et al. | 330/253 |
| 5,563,760 | 10/1996 | Lowis et al. | 361/103 |
| 5,610,557 | 3/1997 | Jett, Jr. | 330/261 |
| 5,734,296 | 3/1998 | Dotson et al. | 330/253 |
| 6,140,877 | * 10/2000 | Furbes | 330/261 X |

* cited by examiner

Primary Examiner—Steven J. Mottola
(74) Attorney, Agent, or Firm—April M. Mosby; W. James Brady; Frederick J. Telecky, Jr.

(57) ABSTRACT

A single pair differential amplifier circuit (90) provides signal amplification across the full amplifier power-supply voltage range. The differential amplifier circuit (90) is coupled to the first rail (122) and the second rail (124) and has a differential input (114 and 116) for receiving a common-mode input voltage. A bias circuit (126) is coupled to the differential amplifier circuit (90) for applying a bias voltage to the differential pair of transistors (102 and 104) such that the bias circuit (126) controls the threshold voltage of the differential pair of transistors (102 and 104) in the response to the common-mode input voltage. The bias circuit (126) turns differential pair of transistors (102 and 104) on when the common-mode input voltage is in a range extending from the first supply voltage to the second supply voltage.

11 Claims, 2 Drawing Sheets

MOSFET SINGLE-PAIR DIFFERENTIAL AMPLIFIER HAVING AN ADAPTIVE BIASING SCHEME FOR RAIL-TO-RAIL INPUT CAPABILITY

This Application Claims Benefit of Provisional Application Ser. No. 60/112785 filed Dec. 18, 1998.

FIELD OF THE INVENTION

This invention relates generally to the field of operation amplifiers; and, in particular, to an adaptive biasing scheme for a differential single-pair MOSFET amplifier input stage using backgate biasing techniques to provide a wide common mode range which includes both the positive and negative power supply voltage rails.

BACKGROUND OF THE INVENTION

Although digital implementations have replaced most analog circuitry, an analog world necessitates the use of operational amplifiers within an integrated circuit to build the interface between external systems and internal electronic circuitry within a variety of electronic devices from medical instruments, portable phones, notebook computers, cassette tape recorders and battery operated electronic devices, to name a few. Operational amplifiers are used primarily with externally applied feedback in pulse shaping, filtering, signal processing and instrumentation applications. In an effort to prolong life and to reduce size and weight of these electronic devices, the industry trend demands a smaller, lower voltage and power consumption operational amplifier. Operational amplifiers can be characterized by their low cost, ease of use and wide availability and, thus, are in high demand.

The ideal operational amplifier is a voltage controlled voltage source having a differential input and a single-ended output. Ideal operational amplifier characteristics include infinite gain, zero input offset voltage, infinite input impedance, zero output resistance, high bandwidth, high speed, no frequency dependence, no temperature dependence, no distortion, no processing dependence, sufficient output drive capabilities, and low power consumption. Manufacturing processes, however, generate less than ideal operational amplifier characteristics. Thus, it is the job of the circuit designer to optimize one or more characteristics of the actual operational amplifier in an effort to compensate for non-ideal conditions.

Conventional operational amplifier designs include at least two stages: an input stage and an output stage. The input stage, having a non-inverting input and an inverting input, derives the difference between the two inputs. The differential amplifier is one of the most widely used classes of gain stages in analog IC design. As FIG. 1 illustrates, the input stage 10 includes a pair of transistors 12 and 14 configured as differential amplifier having two symmetrical circuit branches, wherein each branch includes a transistor 12 and 14 coupled to one of the input terminals 26 and 28. Additionally, as active loads each branch includes a second transistor 16 and 18 having directly coupled gates. Each source of transistors 16 and 18 are tied to an upper power supply rail 20. Each branch beneath differential transistor pair 12 and 14 is coupled to the source of current-source transistor 30. Current source transistor 30 is biased by a voltage $V_{bias}$. Within each branch, the transistor produces a signal proportional to the voltage on the corresponding input terminal 26 and 28. The output 22 and 24 of the input stage 10 is the difference between the signal in each branch 26 and 28 of the differential amplifier. Ideally, the values of corresponding circuit components in the two branches are identical, so that when identical voltages are applied to each input 26 and 28, i.e. a common-mode input voltage, the signals in each branch are also identical and the output of the input stage 10 is zero.

Conventionally, the common-mode input voltage range of a differential gain stage is the maximum range of dc voltage that can be applied, simultaneously, to both inputs without causing the cutoff or saturation of the pair of differential amplifier transistors or the cutoff, saturation, or breakdown of any of the gain stages inside the operational amplifier. A common-mode input voltage which is at or near one of the supply voltages may drive the transistors in the input stage into either a saturation or cutoff condition. This limits the useful range of common-mode input voltages since they must not approach or exceed either of the operational amplifier's supply voltages. A conventional rule of thumb is that the input signal should not come within about 1 volt of either the high or low power supply rails.

In FIG. 1, the lower limit of the input common-mode range is set by the saturation of the current-source transistor 30 having a threshold voltage $V_T$ or the cutoff of gain transistors, 12 and 14. The lower limit occurs when both inputs are lowered, approaching a voltage within the threshold voltage $V_T$ of the lower power supply rail 34 of voltage $-V_{LL}$. The upper limit of the common-mode range is set by the saturation of gain transistors, 12 and 14, as both inputs are raised toward the upper power supply rail 20 of voltage $+V_{HH}$. Thus, there is normally a high or low-end of the power-supply range, depending upon the polarity of the differential pair transistors 12 and 14, where the differential pair of transistors 12 and 14 are not operable.

Consequently, operational amplifiers of conventional design are limited in range of operable common-mode input voltages. A wide common-mode range, however, is desirable, allowing easy amplifier interface with devices generating input signals at various dc levels. Presently, in single-supply or ground-sensing operational amplifier stages, the range can extend down to the negative power supply rail, $-V_{LL}$. Yet, there exists no single pair differential amplifier approach that extends the common-mode range to include both the negative and positive power supply rails, $+V_{HH}$ and $-V_{LL}$, because the threshold voltage of the differential amplifier pair must be reached prior to each transistor becoming conductive.

For this reason, a favored design approach of an input stage within an operational amplifier includes a complementary dual pair of differential amplifiers to compensate for the high or low-end of the power-supply range where one differential pair is operable and the other is not. This complementary dual pair of differential amplifiers has the capability to extend the common-mode range to include both the negative and positive power supply rails, $+V_{HH}$ and $-V_{LL}$. Thus, the amplifier is enabled to have rail-to-rail input capability. More particularly, the amplifier output signal represents the differential input voltage as its common-mode portion travels the full extent of the power-supply range.

An example of such a design is found in U.S. Pat. No. 5,371,474 which describes several embodiments of a differential amplifier having first and second differential portions operating in parallel to provide representative signal amplification across the full power-supply range. As illustrated in FIG. 2, this input stage 40 having a dual differential amplifier pair 50 and 52 offers a solution to the problems faced with the aforementioned single differential amplifier pair input stage. This proposed approach extends the common-mode range to include both the negative and positive power supply rails. The complementary pair of differential amplifiers 50 and 52 are coupled in parallel such that at least one pair is in operation when the common-mode input voltage is at any voltage within the power-supply range.

The first differential amplifier 50 includes a pair of transistors 42 and 44 configured as a differential amplifier having two symmetrical circuit branches, wherein each branch includes a transistor coupled to one of the input terminals 54 and 56. The second differential amplifier 52 includes a pair of transistors 46 and 48 configured as a differential amplifier having two symmetrical circuit branches, wherein each branch includes a transistor coupled to one of the input terminals 54 and 56. One of the differential amplifier pairs 50 is active for input signals 54 and 56 at or near upper power rail voltage $+V_{HH}$, and the other differential amplifier pair 52 is active for input signals at or near lower power rail voltage $-V_{LL}$. Summing circuit 64 sums the outputs of the two differential amplifier pairs to obtain an output for the input stage 40. For input signals 54 and 56 that are not near either supply voltage, both of the differential amplifiers are active to a varying degree. Additional circuitry, such as current control circuit 62, may be incorporated to provide for a smooth transition between states in which only one or the other of the differential amplifiers 50 and 52 is active as a common-mode input voltage varies from one supply voltage 58 to the other 60. In this way, the common-mode input range is extended to include both power supply voltages 58 and 60.

The first differential portion 50 amplifies a differential input signal by dividing a first tail current $I_N$ into a pair of first main currents, $I_1$ and $I_2$, whose difference is representative of the input signal $V_1$ when its common-mode voltage $V_{CM}$ is in the intermediate and high-end ranges. The second differential portion 52 operates in a complementary fashion to amplify the input signal by dividing a second tail current $I_p$ into a pair of second main currents, $I_3$ and $I_4$, whose difference is representative of the input signal when the common-mode voltage $V_{CM}$ is in the intermediate and low-end ranges. As a result, the differential amplifier has rail-to-rail input capability.

However, the increased complexity of an op-amp having dual differential amplifier pairs in the input stage potentially decreases the speed of the amplifier and increases the number of errors during the fabrication process. Just as variations in symmetry between branches of a single differential input stage cause an op-amp of conventional design to exhibit a characteristic input offset voltage, an operational amplifier design employing dual input stage differential amplifiers is subject to similar variations in symmetry between branches of each of its differential amplifiers.

Hence, a need exists for a versatile operational amplifier that can be used in a variety of applications powered from battery sources, especially low voltage applications that do not diminish the characteristics of an operational amplifier. A need exists for an operational amplifier input stage that provides high input impedance and a low input offset voltage. A need exists for an operational amplifier that minimizes transistors in the signal path for providing high speed and high bandwidth and still have both input and output rail to rail capabilities. A need exists for a single pair differential gain stage within an operational amplifier capable of a wide common-mode range, inclusive of both negative and positive power supply voltage rails.

SUMMARY OF THE INVENTION

A single pair differential amplifier gain stage of an operational amplifier having a biasing scheme in accordance with the present invention is capable of providing a wide common-mode voltage range including both positive and negative power supply rails through the use of a biasing scheme which biases the backgate voltages of the differential amplifier transistors. The differential amplifier gain stage circuit is operable between a first and second supply voltage which constitutes a power supply range including a first-end range extending to the first supply voltage and a second-end range extending to the second supply voltage.

The bias circuit coupled to the differential amplifier circuit applies a bias voltage to the differential pair of transistors in such a way that the threshold voltages of the differential pair of transistors are adjusted in the response to the common-mode input voltage to turn the differential pair of transistors on when the common-mode input voltage is in a range extending from the first supply voltage to the second supply voltage.

Thus, depending on the level of the input common-mode voltage, the biasing scheme alters the threshold voltages of the input gain transistors, enabling a wider common-mode voltage range inclusive of both power supply rails.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
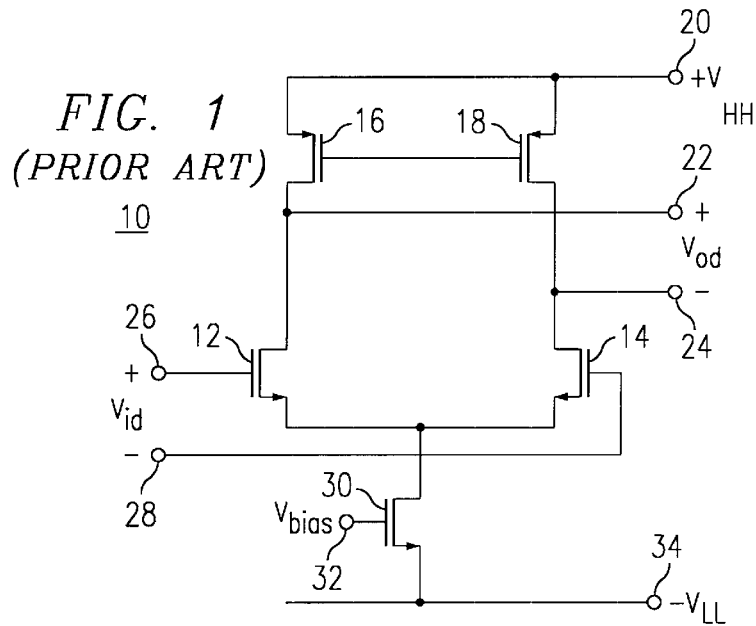
FIG. 1 is a schematic of a conventional differential amplifier.
Figure 2:
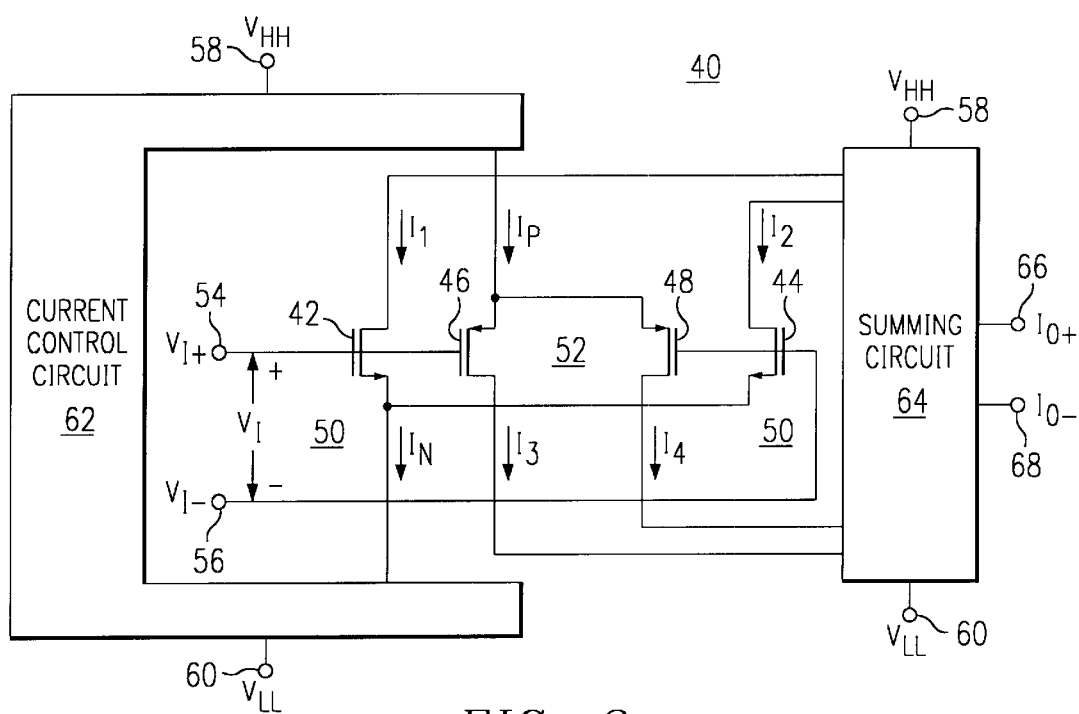
FIG. 2 is a schematic of a dual pair differential amplifier in accordance with the prior art having rail-to-rail input capability.
Figure 3:
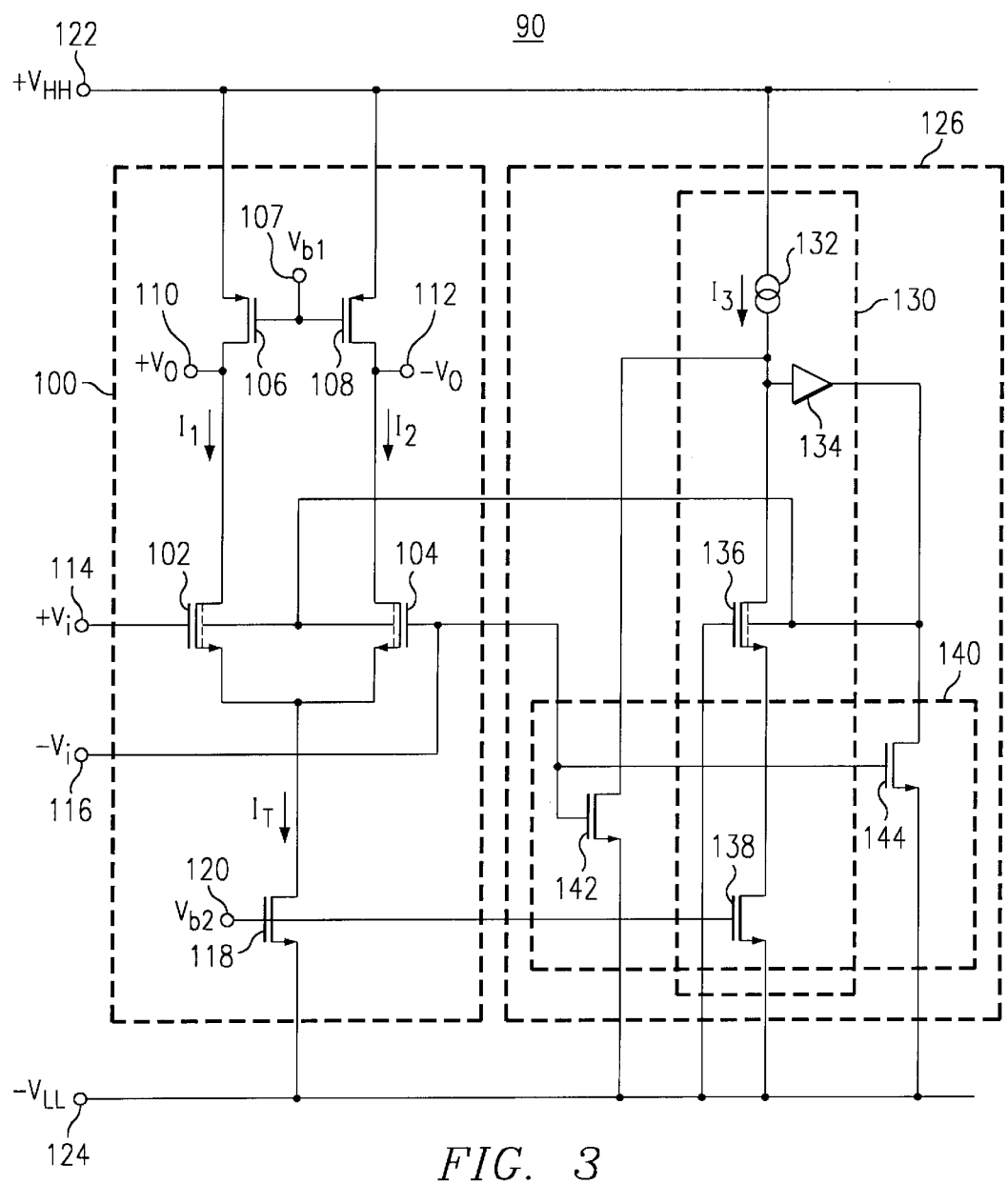
FIG. 3 is a schematic of single pair differential amplifier having rail-to-rail input capability in accordance with the present invention.

FIG. 3 illustrates a schematic of a differential amplifier input stage 90 including the biasing scheme in accordance with the present invention. This input stage 90 provides a wide common-mode voltage range including both positive and negative power supply rails through biasing the backgates of the pair of differential amplifier transistors, 102 and 104.

Specifically, input stage 90 includes a differential amplifier circuit 100 and bias circuit 126, coupled one to another. The differential amplifier circuit 100 includes a pair of like-polarity differentially coupled field effect transistors, 102 and 104, configured as a differential amplifier having two symmetrical circuit branches, wherein each branch includes a transistor 102 and 104 coupled to one of the input terminals 114 and 116, respectively. A pair of like-polarity common-gate field effect transistors, 106 and 108, are coupled to transistors 102 and 104, respectively, for providing an active load within each branch. The gates of transistors 106 and 108 are tied together at node 107 where bias voltage $V_{b1}$ is applied. The source of transistors 106 and 108 are tied to power supply rail 122. The drain of transistors 106 and 108 are tied to output nodes 110 and 112, respectively. In addition, the drain of transistors 102 and 104 are coupled to output nodes 110 and 112, respectively. The pair of like-polarity common-gate coupled field effect transistors, 106 and 108, are of opposite polarity to the pair like-polarity differentially coupled field effect transistors, 102 and 104. The drain of a field effect transistor 118 ties each branch together at the source of transistors, 102 and 104. The source of transistor 118 is connected to the second power supply rail 124. The gate of transistor 118 is coupled at node 120 to a bias voltage $V_{b2}$.

Bias circuit 126 includes a replica circuit 130 and a switching circuit 140, coupled one to another. The replica circuit 130 includes a current source 132. The drain of a replica field effect transistor 136 is connected in series to the current source 132. The backgate of replica transistor 136 is coupled to the backgates of the pair of like-polarity differentially coupled field effect transistors, 102 and 104 of differential amplifier circuit 100 for providing backgate voltage to the pair. The replica transistor 136 is equivalent in size to either of the pair of like-polarity differentially coupled field effect transistors, 102 and 104. An operational amplifier 134 coupled to the drain and backgate of replica transistor 136 supplies a servo loop gain and forms a feedback amplifier to modulate the backgate voltage supplied to the pair of like-polarity differentially coupled field effect transistors, 102 and 104. The drain of a current source transistor 138 is coupled to the source of replica transistor 136 to supply current equal to one half of the tail current supplied by transistor 118. Both the gate of replica transistor 136 and the source of the current source transistor 138 is coupled to the second power supply rail 124. The gate of the current source transistor 138 is coupled to the gate of transistor 118. The current source transistor 138 is equivalent to half the size the transistor 118. Thus, replica and current source transistors, 136 and 138 are a replica of half of the input differential stage 100.

The switching circuit 140 includes a field effect transistor 142 coupled in parallel to the series connection of transistors, 136 and 138, between current source 132 and the lower power supply rail 124. A field effect transistor 144 is coupled between lower power supply rail 124 and the node that couples the backgates of transistors 102, 104 and 136. The gates of transistors 142 and 144 are coupled to input node 116.

For simplicity, analysis of the circuit is described in the case where the field effect transistors 102, 104, 118, 136, 138, 142, and 144, are n-channel MOS devices and field effect transistors 106 and 108 are p-channel MOS devices. In operation, the differential pair of input transistors, 102 and 104, amplify a differential input signal 114 and 116 of voltages $+V_1$, and $-V_1$, by dividing a first tail current $I_T$ into a pair of main currents, $I_1$ and $I_2$. Transistor 118 provides tail current $I_T$ for the pair of like-polarity differentially coupled field effect transistors, 102 and 104.

There are two voltage ranges of operation for the single pair differential amplifier 100. The first-end voltage ranges from the upper power supply rail voltage $+V_{HH}$ to voltage $V_{gst}$, the gate to source voltage $V_{gs}$ minus the threshold voltage $V_T$ of the transistors 102 and 104. It is within this range of common-mode voltage $V_{cm}$ that the transistors 102 and 104 are operable. The second-end voltage ranges from voltage $V_{gst}$ to the lower power supply rail. It is during the second-end range of input voltage that transistors 102 and 104 are normally cutoff without biasing supplied by bias circuit 126. To control bias applied in either the first or second-end range, switching circuit 140 switches the replica circuit 130 off and on. When the common-mode voltage $V_{CM}$ is in a first-end range, the replica circuit 130 is switched off. When the input signal $V_I$ has a common-mode voltage $V_{CM}$ in the second-end range, switching circuit 140 switches replica circuit 130 on to supply a backgate voltage that adjusts the threshold voltage of transistors 102 and 104. As a result, the differential pair of input transistors, 102 and 104, is operable in both first and second-end ranges.

Replica circuit 130 is connected to the differential amplifier circuit 100 for replicating half of the input differential stage 100 and supplying backgate voltage to the differential amplifier input transistor pair, 102 and 104, when necessary. In this manner, the backgates of the differential amplifier input transistor pair 102 and 104 are raised to a voltage higher than the respective source of each transistor 102 and 104. The assumption is the body effect of each transistor 102 and 104 is sufficiently strong to allow a threshold voltage polarity change without forward biasing the body-source parasitic diode junction.

More particularly, during the first-end range of the common-mode voltage $V_{CM}$, switching circuit 140 including field effect transistors 142 and 144 acts as a switch to turn the biasing of replica circuit 130 off. In this first-end range, the common-mode voltage $V_{CM}$ exceeds the threshold voltage of transistors 142 and 144. Consequently, transistors 142 and 144 turn on removing the replica circuit 130 by connecting the drain of replica transistor 136 to the lower power supply rail 124 having voltage $-V_{LL}$. Since drain of transistor 144 is connected to the backgates of differentially coupled field effect transistors, 102 and 104, when transistor 144 turns on, the drain to source resistance of transistor 144 becomes very low and effectively the backgates of transistors 102 and 104 are short circuited to the lower power supply voltage $-V_{LL}$, as well. Accordingly, the body effect is removed since it is not necessary to modulate the back gates of differentially coupled field effect transistors, 102 and 104.

During the second-end range of common-mode voltage $V_{CM}$, within the replica circuit 130, current source 132 feeds replica transistor 136. The magnitude of the current from current source 132 is approximately 80% of that required by the replica current source 138. Accordingly, the drain voltage of replica transistor 136 rises such that servo loop amplifier 134 pulls up the backgate voltage of replica transistor 136; thereby, decreasing the threshold voltage of replica transistor 136 to such an extent that the voltage Vgst of transistor 136 is set to a level which will allow current to pass sent from current source 132 through transistor 136 to transistor 138. The replica circuit 130 applies this same backgate voltage of replica transistor 136 to the backgates of differential amplifier transistors, 102 and 104. Thus, when transistors, 102 and 104, receive an input common-mode voltage $V_{CM}$ less than $V_{gst}$ of either transistor 102 and 104 to the voltage of the lower supply rail $-V_{LL}$, transistors 102 and 104 will pass approximately 80% of the tail current $I_T$ and, thus, are operable.

Furthermore, during operation in the second-end range of the common-mode voltage, switching circuit 140 including field effect transistors 142 and 144 acts as a switch which turns the biasing of replica circuit 130 on. In this second-end range, the common-mode voltage $V_{CM}$ is less than the threshold voltage of transistors 142 and 144. Consequently, transistors 142 and 144 are not conductive. Thus, the switching circuit 140 does not block the replica circuit 130 from providing backgate biasing to differential amplifier transistors 102 and 104. In summary, the biasing scheme provides a negative threshold voltage such that the amplifier remains in operation over a wide input common-mode voltage range inclusive of the both power supply rails.

As stipulated, the circuit 90 may incorporate field effect transistors 102, 104, 118, 136, 138, 142, and 144 as n-channel MOS devices and, consequently, field effect transistors 106 and 108 as p-channel MOS devices. Conversely, the circuit 90 may incorporate field effect transistors 102, 104, 118, 136, 138, 142, and 144 as p-channel MOS devices and field effect transistors 106 and 108 as n-channel MOS devices. Thus, in the case where field effect transistors 102, 104, 118, 136, 138, 142, and 144 are n-channel MOS devices, the replica circuit 130 provides a backgate voltage which produces a negative threshold voltage. Accordingly, in the case where field effect transistors, 102, 104, 118, 136, 138, 142, and 144 are p-channel MOS devices, the replica circuit 130 provides a backgate voltage which produces a positive threshold voltage.

Those skilled in the art to which the invention relates will appreciate that various substitutions, modifications and additions can be made to the described embodiments, without departing from the spirit and scope of the invention as defined by the claims.

The present invention largely uses FETs. Nonetheless, certain parts of the invention can be alternatively implemented with bipolar transistors. The invention thus can be fabricated in both "CMOS" and "BICMOS" integrated-circuit technologies.

What is claimed is:

1. A circuit, comprising:
   a first rail for receiving a first supply voltage;
   a second rail for receiving a second supply voltage;
   a differential amplifier circuit coupled to the first rail and the second rail and having a differential input for receiving a common-mode input voltage, the differential amplifier circuit including a differential pair of transistors;
   a bias circuit coupled to said differential amplifier circuit for applying a bias voltage to the differential pair of transistors, the bias circuit controlling the threshold voltage of the differential pair of transistors in the response to the common-mode input voltage to turn the differential pair of transistors on when the common-mode input voltage is in a range extending from the first supply voltage to the second supply voltage wherein the bias circuit provides a first bias voltage to turn the differential pair of transistors on when the common mode input voltage is in a first range extending from the first supply voltage to a first threshold voltage and a second bias voltage to turn the differential pair of transistors on when the common mode input voltage is in the second range extending from second supply voltage to the first threshold voltage.

2. A circuit, comprising:
   a first rail for receiving a first supply voltage;
   a second rail for receiving a second supply voltage;
   a differential amplifier circuit coupled to the first rail and the second rail and having a differential input for receiving a common-mode input voltage, the differential amplifier circuit including a differential pair of transistors;
   wherein the differential amplifier circuit comprises:
      a pair of like-polarity differentially coupled field effect transistors, the first and second transistor of the pair differentially respond to the input signal by dividing the first tail current between the currents;
      a pair of like-polarity common-gate coupled field effect transistors, the third and fourth transistors of the pair provide an active load to the differential means, the pair of like-polarity common-gate coupled field effect transistors are of opposite polarity to the pair of like-polarity differentially coupled field effect transistors; and
      a fifth field effect transistor that provides tail current for the pair of like-polarity differentially coupled field effect transistors; and
   a bias circuit coupled to said differential amplifier circuit for applying a bias voltage to the differential pair of transistors, the bias circuit controlling the threshold voltage of the differential pair of transistors in the response to the common-mode input voltage to turn the differential pair of transistors on when the common-mode input voltage is in a range extending from the first supply voltage to the second supply voltage.

3. A circuit, comprising:
   a first rail for receiving a first supply voltage;
   a second rail for receiving a second supply voltage;
   a differential amplifier circuit coupled to the first rail and the second rail and having a differential input for receiving a common-mode input voltage, the differential amplifier circuit including a differential pair of transistors;
   a bias circuit coupled to said differential amplifier circuit for applying a bias voltage to the differential pair of transistors, the bias circuit controlling the threshold voltage of the differential pair of transistors in the response to the common-mode input voltage to turn the differential pair of transistors on when the common-mode input voltage is in a range extending from the first supply voltage to the second supply voltage,
   wherein the biasing circuit comprises:
      a replica circuit coupled to the differential amplifier circuit for replicating half of the differential pair of transistors and for applying a voltage across the backgates of the differential pair of transistors to supply a threshold voltage such that when the common-mode voltage $V_{CM}$ is in the second-end range the differential pair of input transistors is operable; and
      a switching circuit coupled to the differential amplifier circuit and the replica circuit to turn the replica circuit on when the input common-mode voltage $V_{CM}$ is in the second-end range beyond the threshold voltage of the differential pair of transistors and to turn the replica circuitry off when the common-mode voltage $V_{CM}$ is in the first-end range.

4. The circuit of claim 3, wherein the replica circuit comprises:
   a current source;
   a sixth field effect transistor coupled in series to the current source, the backgate of the sixth field effect transistor is coupled to the backgate of the pair of like-polarity differentially coupled field effect transistors of the differential amplifier circuit for providing backgate voltage to the pair of like-polarity differentially coupled field effect transistors, the sixth field effect transistor is equivalent in size to either of the pair of like-polarity differentially coupled field effect transistors of the differential amplifier circuit;
   an amplifier coupled to the sixth field effect transistor to form a feedback amplifier to modulate the backgate voltage supplied to the pair of like-polarity differentially coupled field effect transistors of the differential amplifier circuit; and
   a seventh field effect transistor coupled in series to the sixth field effect transistor to supply current to the replica circuit, the seventh field effect transistor is equivalent to half the size the fifth field effect transistor of the differential amplifier circuit.

5. The circuit of claim 3, wherein the switching circuit comprises:
   an eighth field effect transistor coupled in parallel to the sixth and seventh field effect transistors; and
   a ninth field effect transistor coupled in series to the amplifier of the replica circuit, the series coupled ninth field effect transistor and amplifier coupled in parallel to the eighth field effect transistor.

6. An electronic circuit operable between first and second supply voltages which constitute a power supply range including a first-end range extending to the first supply voltage and a second-end range extending to the second supply voltage, the circuit comprising:
   a differential means having a differential pair of transistors having a first threshold voltage for amplifying a differential input signal when its common-mode voltage $V_{CM}$ is in the first-end range;
   a replica circuitry means coupled to the differential means for replicating half of the differential pair of transistors and for applying a voltage across the backgates of the differential pair of transistors to supply a second threshold voltage such that when the common-mode voltage $V_{CM}$ is in the second-end range the differential pair of input transistors is operable; and
   a switching means coupled to the differential means and the replica circuitry means to turn the replica circuitry means on when the input common-mode voltage $V_{CM}$ is in the second-end range beyond the first threshold voltage of the differential pair of input transistors and to turn the replica circuitry off when the common-mode voltage $V_{CM}$ is in the first-end range.

7. The circuit as claimed in claim 6, wherein the differential means comprises
   a pair of like-polarity differentially coupled field effect transistors, a first and second transistor of the pair differentially respond to the input signal;
   a pair of like-polarity common-gate coupled field effect transistors, a third and fourth transistor of the pair provide an active load to the differential means, the pair of like-polarity common-gate coupled field effect transistors are of opposite polarity to the pair of like-polarity differentially coupled field effect transistors; and
   a fifth field effect transistor that provides tail current for the pair of like-polarity differentially coupled field effect transistors.

8. The circuit as claimed in claim 7, wherein the replica circuitry means comprises:
   a current source;
   a sixth field effect transistor coupled in series to the current source, the backgate of the sixth field effect transistor is coupled to the backgate of the pair of like-polarity differentially coupled field effect transistors of the differential means for providing backgate voltage to the pair of like-polarity differentially coupled field effect transistors, the sixth field effect transistor is equivalent in size to either of the pair of like-polarity differentially coupled field effect transistors of the differential means;
   an amplifier coupled to the sixth field effect transistor to form a feedback amplifier to modulate the backgate voltage supplied to the pair of like-polarity differentially coupled field effect transistors of the differential means; and
   a seventh field effect transistor coupled in series to the sixth field effect transistor to supply current to the replica circuitry means, the seventh field effect transistor is equivalent to half the size the fifth field effect transistor of the differential means.

9. The circuit as claimed in claim 8, wherein the switching means comprises:
   an eighth field effect transistor coupled in parallel to the sixth and seventh field effect transistors; and
   a ninth field effect transistor coupled in series to the amplifier of the replica circuitry means, the series coupled ninth field effect transistor and amplifier coupled in parallel to the eighth field effect transistor.

10. The circuit as claimed in claim 9, wherein the first, second, fifth, sixth, seventh, eighth, and ninth field effect transistors are n-channel MOS devices.

11. The circuit as claimed in claim 9, wherein the first, second, fifth, sixth, seventh, eighth, and ninth field effect transistors are p-channel MOS devices.

* * * * *